United States Patent [19]

Wong

[11] Patent Number: 5,481,223
[45] Date of Patent: Jan. 2, 1996

[54] BI-DIRECTIONAL SPATIAL POWER COMBINER GRID AMPLIFIER

[75] Inventor: Sam H. Wong, Yorba Linda, Calif.

[73] Assignee: Rockwell International Corporation, Seal Beach, Calif.

[21] Appl. No.: 305,245

[22] Filed: Sep. 13, 1994

[51] Int. Cl.⁶ .................................................. H03F 3/68
[52] U.S. Cl. ...................................... 330/124 R; 330/295
[58] Field of Search ................................ 330/124 R, 286, 330/287, 295; 343/701

[56] References Cited

U.S. PATENT DOCUMENTS

| | | | |
|---|---|---|---|
| 4,588,962 | 5/1986 | Saito et al. | 330/286 |
| 5,214,394 | 5/1993 | Wong | 330/286 |
| 5,329,248 | 7/1994 | Izadian | 330/295 |

OTHER PUBLICATIONS

"A Grid Amplifier" *IEEE Microwave and Guided Wave Letters*, vol. 1, No. 11, Nov. 1991, Moonil Kim, et al., pp. 322–324.

"Bi–Directional Spatial Power Combiner for Millimeter–Wave Solid State Amplifiers" Work Shop on Milimeter Wave Power Generation and Beam Control, Sep. 14, 1993, Sam H. Wong, et al.

McGraw–Hill Dictionary of Scientific and Technical Terms, Fourth Edition, Sybil P. Parker, Editor in Chief, McGraw–Hill Book Company, p. 548 copyright 1989.

*Primary Examiner*—James B. Mullins
*Attorney, Agent, or Firm*—George A. Montanye; Charles T. Silberberg; Tom Streeter

[57] ABSTRACT

A bi-directional spatial power combiner grid amplifier has an array of parasitic elements between the lens and the amplifier. The elements have different impedances to radiation of a first polarization (incident radiation) and of a second polarization which is orthogonal to the first (amplified radiation), thereby providing impedance matching to both the input and the output of the grid amplifier. The elements preferably are separated slots or dipoles (some in each direction of polarization), crossed slots or dipoles, or micropatches.

18 Claims, 9 Drawing Sheets

*FIG. 1 GRID AMPLIFIER. PRIOR ART*

BI-DIRECTIONAL SPATIAL POWER COMBINER GRID AMPLIFIER

RELATED APPLICATION

This invention is related to the invention disclosed in my pending application (with other co-inventors), Ser. No. 08/304,993, filed concurrently herewith, entitled "Space-Fed Horn for Quasi-Optical Spatial Power Combiners," the disclosure of which is incorporated herein by reference.

BACKGROUND

This invention relates to Extremely High Frequency (EHF) and Millimeter have (MMN) amplifiers, and has particular relation to amplifier's using quasi-optical spatial power combining techniques.

FIG. 1 shows the grid amplifier disclosed in Kim etal., "A Grid Amplifier", IEEE Microwave and Guided Nave Letters, Vol. 1, No. 11, November 1991, the disclosure of which is incorporated herein by reference. Input microwaves with a vertically polarized E field pass, left to right, through an input polarizer of horizontal wires and incident on a grid amplifier. The horizontal wires affect only the non-existent horizontally polarized component of the input microwaves. The grid amplifier amplifies these input microwaves and radiates horizontally polarized output microwaves, both to the left and to the right.

The output microwaves moving to the right pass through an output polarizer of vertical wires, which have no effect on the horizontally polarized output microwaves. The (horizontally polarized) output microwaves moving to the left reflect from the horizontal wires of the input polarizer and pass through the amplifier grid unchanged; the amplifier grid detects only vertically polarized microwaves. The input polarizer is placed at a distance from the amplifier grid such that the reflected microwaves from the input polarizer combine constructively with the output microwaves propagated from the amplifier grid directly to the right. The input polarizer also prevents (or greatly reduces) feedback of the output microwaves back into the input horn (see FIG. 2). These polarizers provide the additional functions of independent tuning of the input and output circuits; that is, the act as matching impedances for the grid amplifiers.

My earlier patent, "High Efficiency Bi-Directional Spatial Power Combiner Amplifier," U.S. Pat. No. 5,214,394, issued May 25, 1993, the disclosure of which is incorporated herein by reference, uses a single horn both for input and output, as shown in FIG. 3. An ortho mode transducer or a circulator is used to isolate the output signal from the input signal. The side of the amplifier grid facing away from the input-output horn may be used to supply power and remove heat. If this approach is used for Kim's grid amplifier, the capacity to match the impedance of the horn to that of free space is lost, however, especially since required impedances may well differ for the input and output modes.

SUMMARY OF THE INVENTION

The present invention overcomes this limitation. Instead of a pair of polarizers made of wires. it accomplishes impedance matching by the use of a planar array of orthogonal parasitic elements, such as slots, micropatches, or d}poles. A plane wave can therefore be passed bi-directionally, and the input and output circuits can be independently tuned.

DETAILED DESCRIPTION OF THE DRAWINGS

Figure 1:
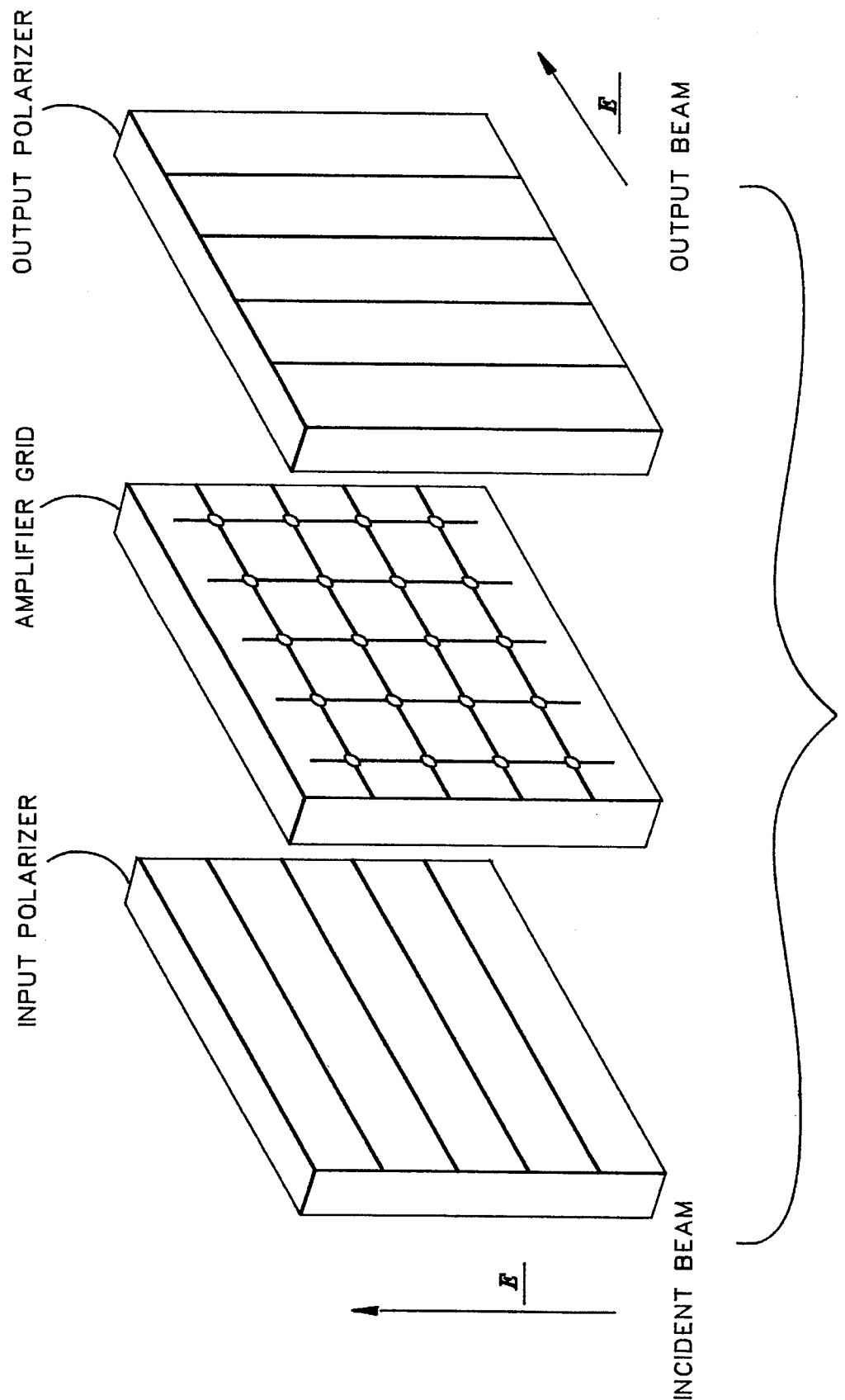
FIG. 1 shows a conceptual view of the Kim grid amplifier.
Figure 2:
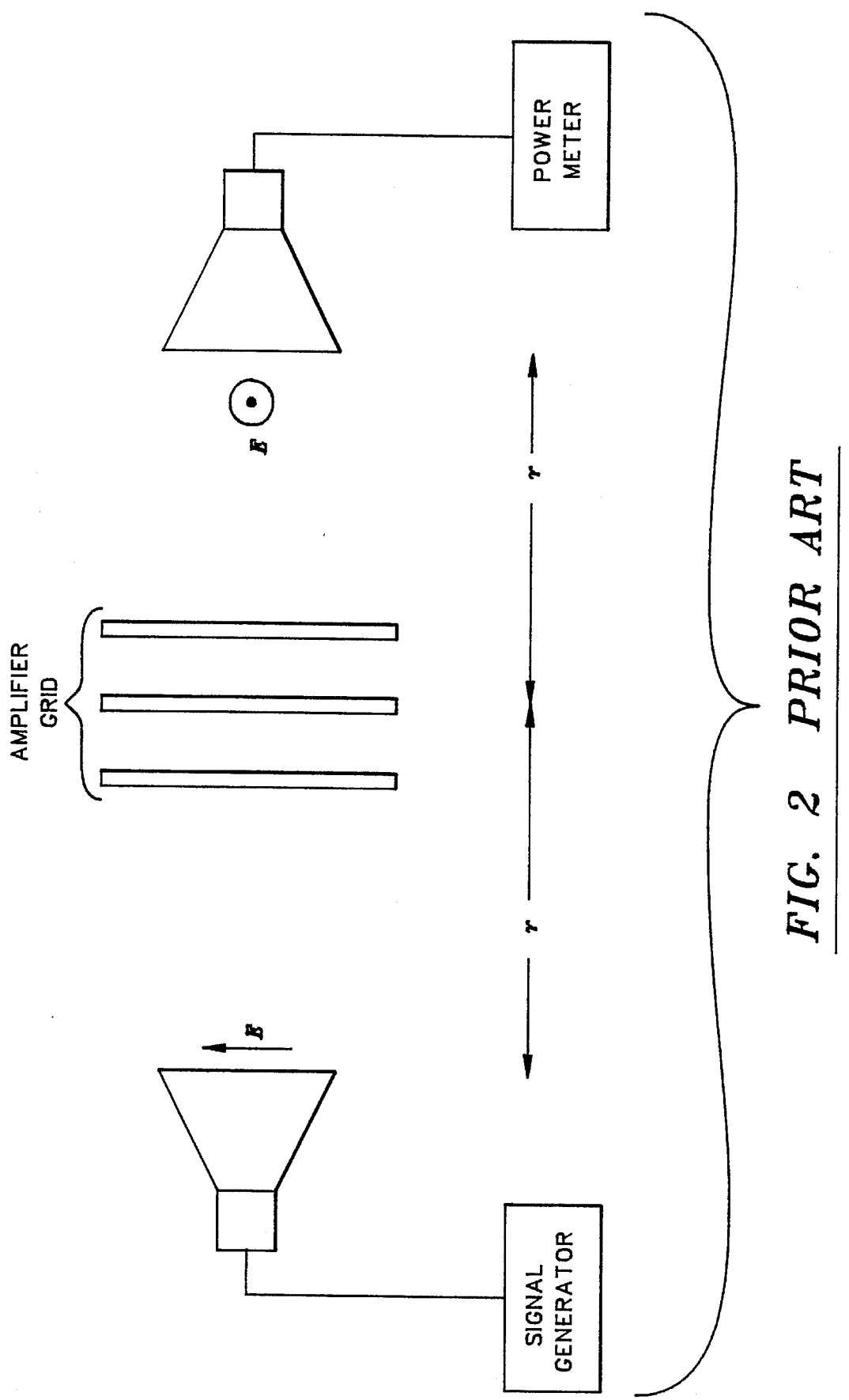
FIG. 2 shows a cross section of the conceptual Kim grid amplifier in operation between a signal generator and a power meter.
Figure 3:
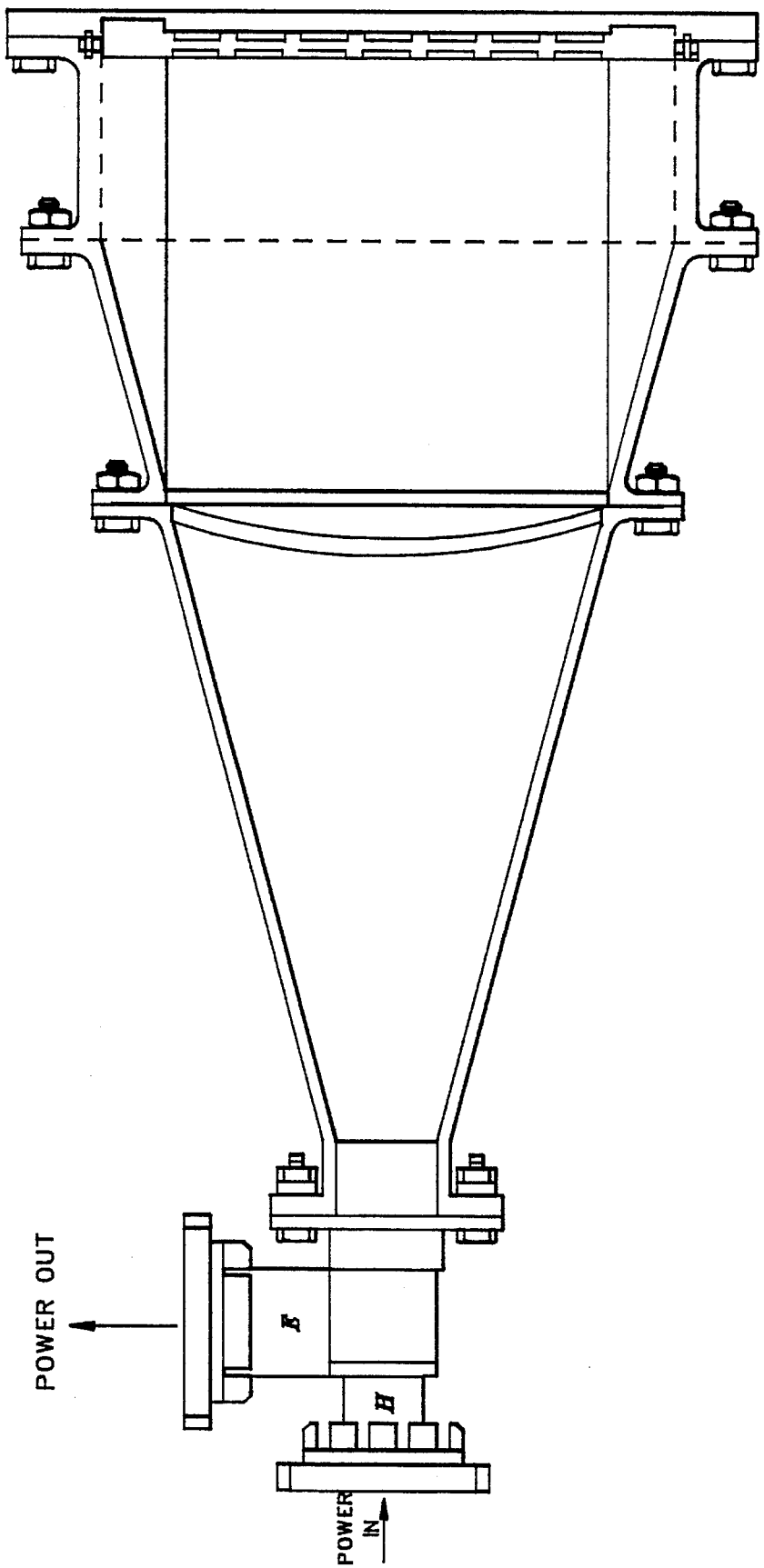
FIG. 3 shows a cross section of my '394 amplifier.

FIGS. 1–3 have been discussed above and will not be further discussed.

In General

Figure 4:
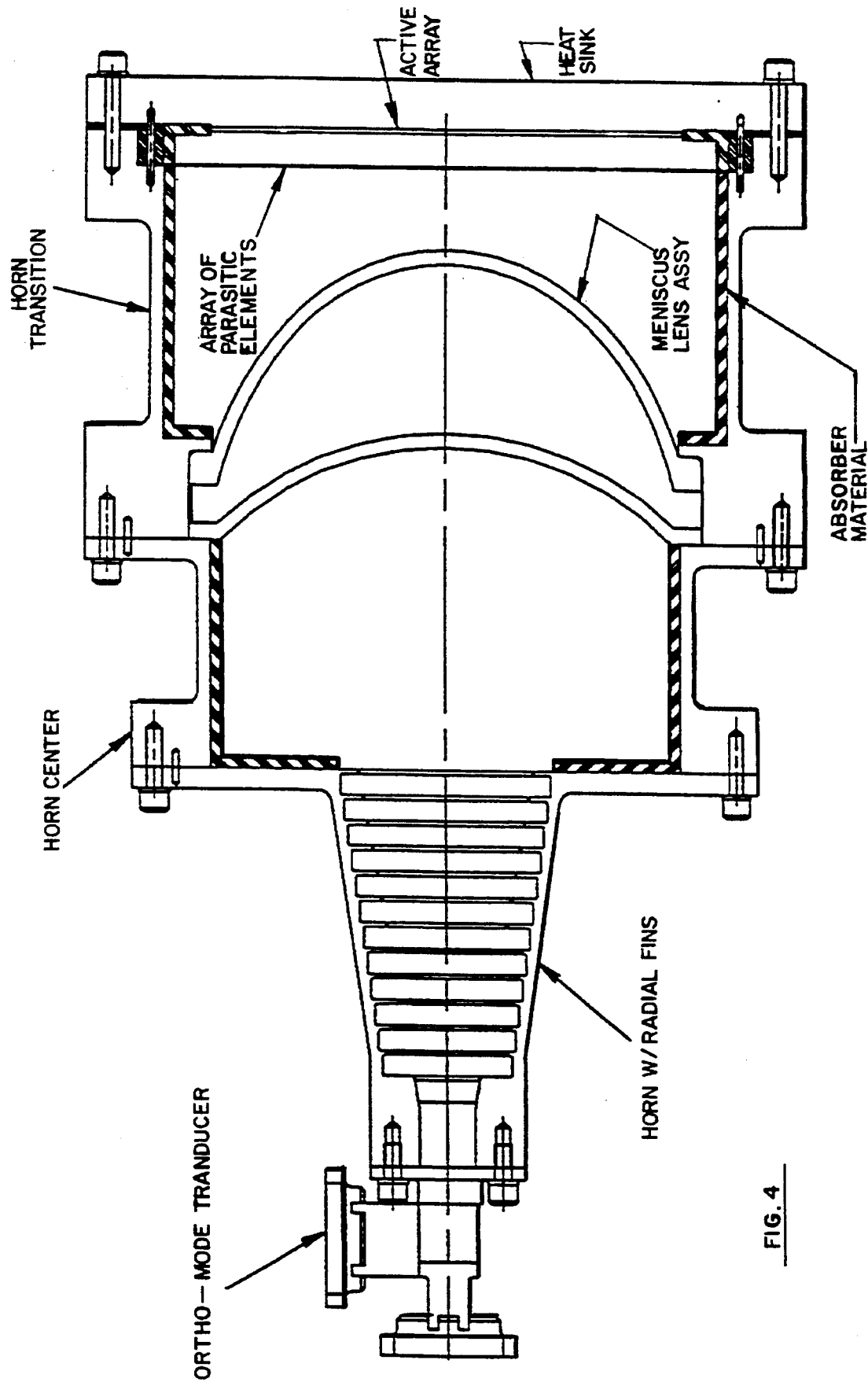
FIG. 4 shows a cross section of the present invention, and also discloses aspects of the invention of the related application.

FIG. 4 shows a cross section of the present invention. A circuit board is placed between the collimating lens and the amplifier grid. The collimating lens is structured to provide an equal amount of power to each area of the amplifier grid, since the number of amplifiers per unit area is the same throughout the grid, namely, the greatest number practicable. The lens is also structured such that all parts of the input collimated beam are in phase; that is, the input collimated beam is planar.

The circuit board itself is either metallic or dielectric. It has, however, a plurality of small circuit elements incorporated onto or into it. The elements correspond to each polarization, and are preferably identical, at least statistically, over the circuit board. The shapes and sizes of the elements are selected to provide the desired impedances for each polarization of radiation, vertical and horizontal.

Orthogonal Slots

Figure 5:
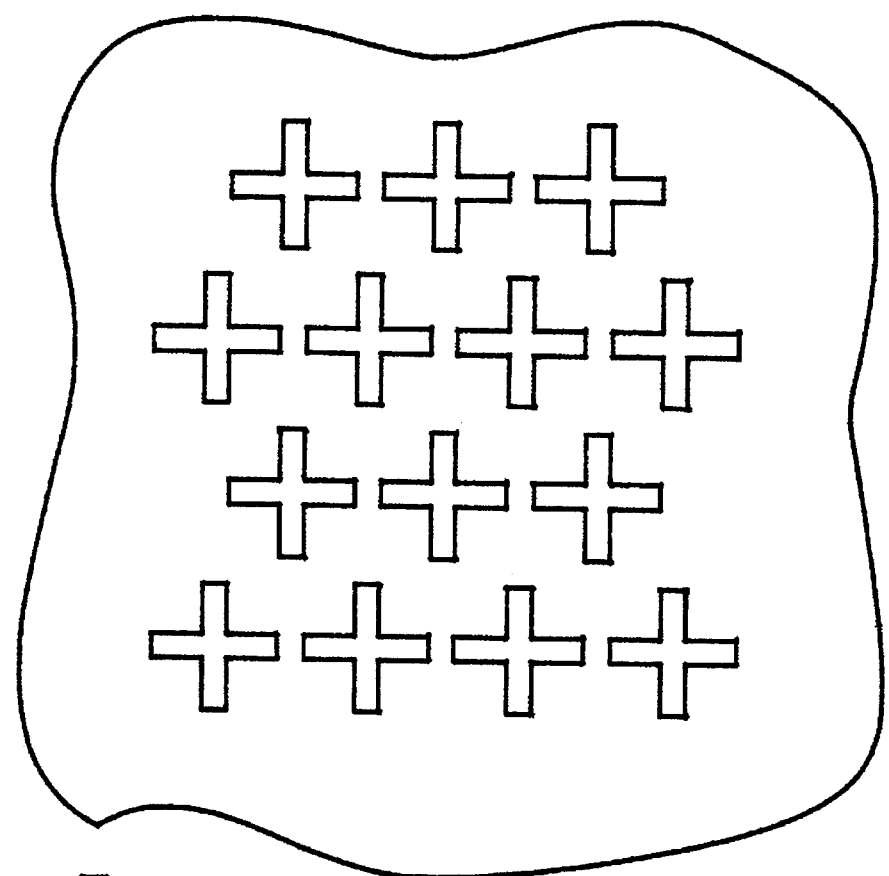
FIG. 5 shows a crossed slot embodiment of the present invention.

FIG. 5 shows a crossed slot embodiment of the present invention. The horizontal slot length and width control and provide the vertical polarization impedance match, and the vertical slot length and width control and provide the horizontal polarization impedance match. The slot length to slot width ratio is typically five to one (5:1). The length of the slot depends on the operating frequency and on the impedance of the grid amplifiers. The typical slot length is approximately one half wavelength ($\lambda/2$) and depends on the operating frequency and operating medium. For example, at 35 GHz, the free space wavelength ($\lambda$) is 0.34 inch (8.6 mm). If the slots are on a metallic plate, the slot length would be approximately 0.17 inch (4.3 mm). If the slots are on a dielectric printed circuit, then the slot length would be less than 0.17 inch (4.3 mm). How much less depends on the relative dielectric constant ($\epsilon_r$) of the circuit board. Since the slots are not entirely embedded in the dielectric, the slots will be less than half of the free space wavelength, but greater than half of the wavelength in the dielectric medium, i.e., $(\lambda/2)(\epsilon_r)^{-\frac{1}{2}} \leq 1 \leq \lambda/2$. The center-to-center spacing between slots is typically on the order of a half wavelength or less.

Figure 6:
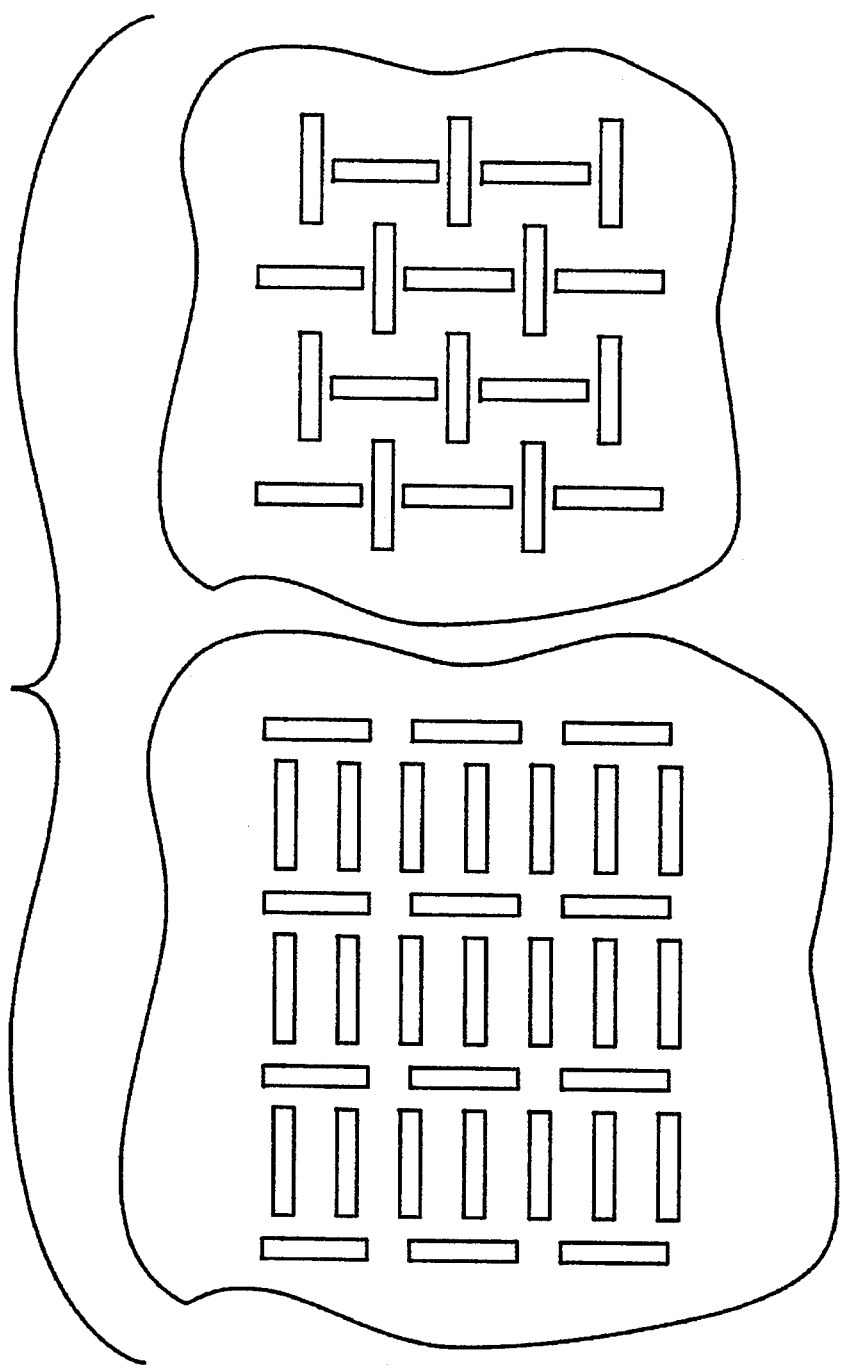
FIG. 6 shows a separated orthogonal slot embodiment of the present invention.

FIG. 6 shows two different separated orthogonal slot embodiments of the present invention. This arrangement separates the vertical slots from the horizontal slots. The number (or density) of vertical slots may differ from that of the horizontal slots. A separated orthogonal slot arrangement also reduces the interactions or mutual couplings between orthogonal slots.

Variations

Figure 7:
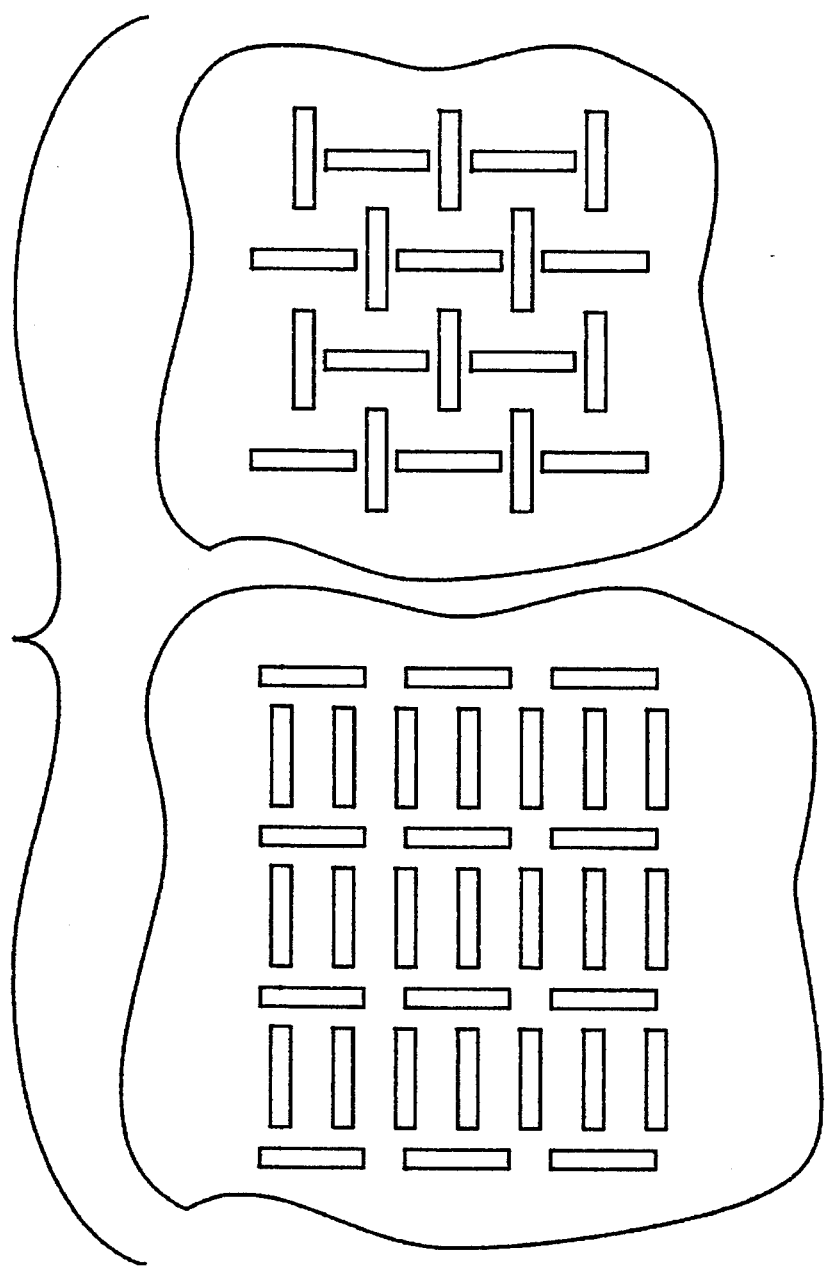
FIG. 7 shows an orthogonal dipole embodiment of the present invention.
Figure 8:
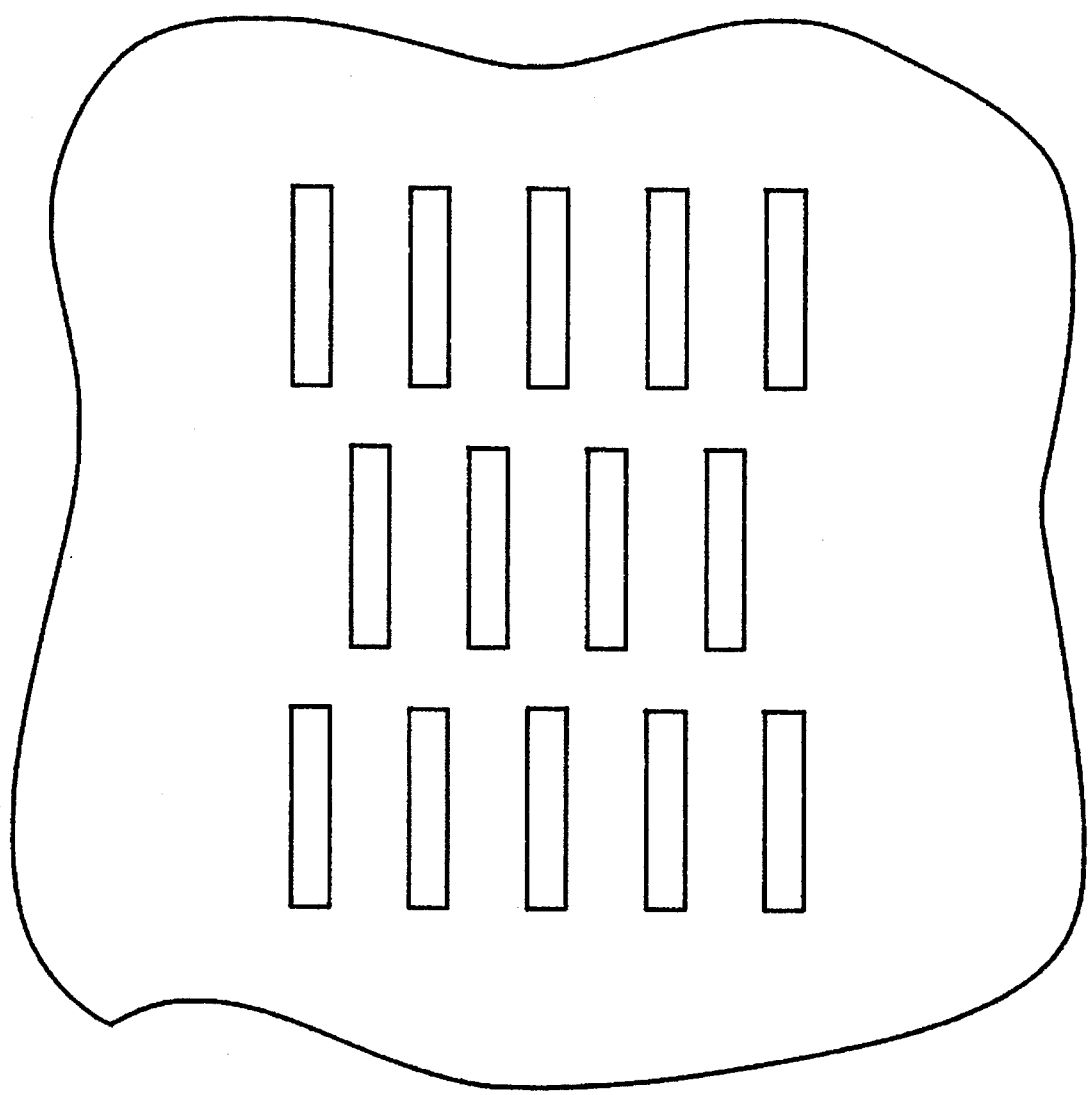
FIG. 8 shows a rectangular micropatch embodiment of the present invention.
Figure 9:
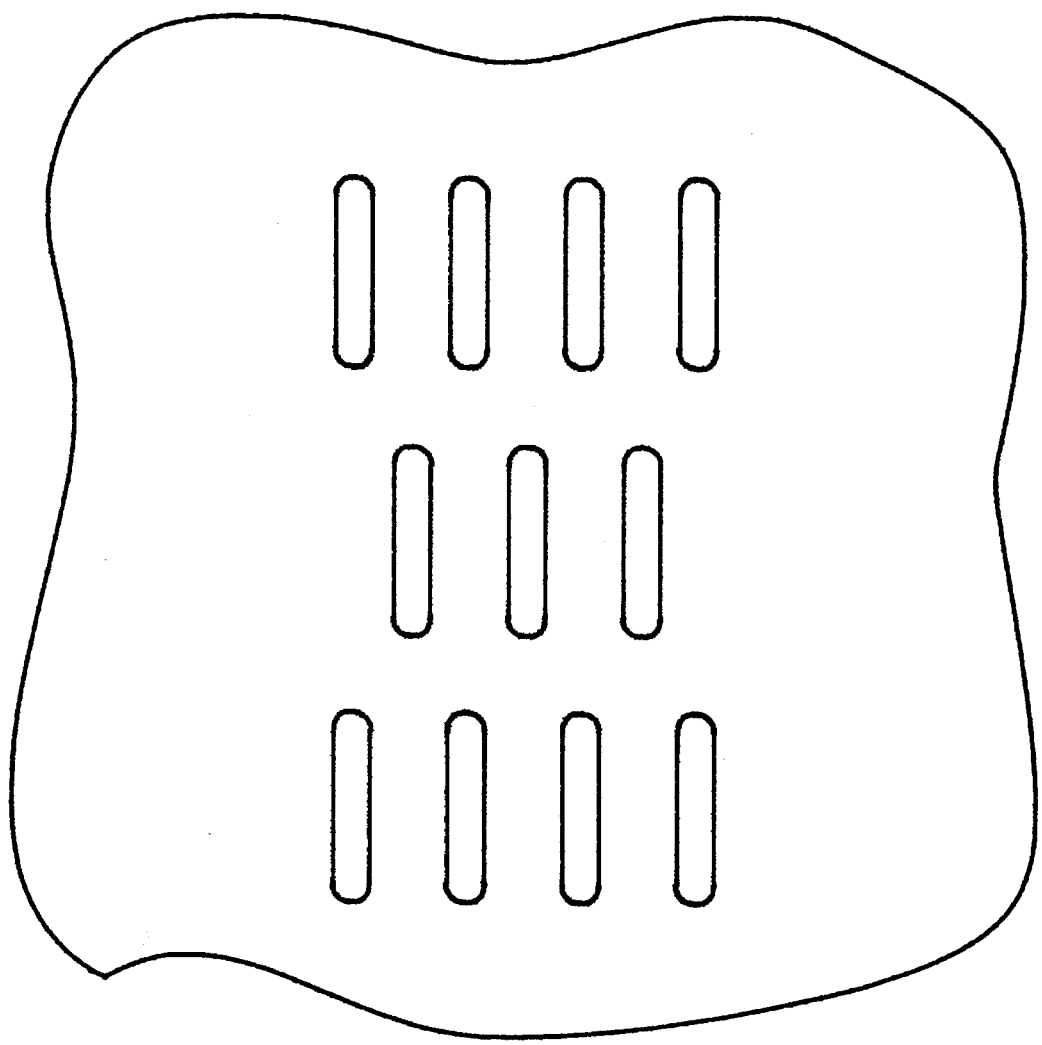
FIG. 9 shows an elliptical micropatch embodiment of the present invention.

The slot arrangements of FIG. 5 and FIG. 6 are shown as typical. Other arrangements are acceptable as long as they provide the proper impedance match for the grid amplifiers. Furthermore, the orthogonal slots of FIGS. 5 and 6 are only one example of suitable impedance matching elements. Other elements include printed circuit orthogonal dipoles (FIG. 7), or rectangular (FIG. 8) or elliptical (FIG. 9) micropatch elements, or the like. It is important only that the desired impedance matching of the vertical and horizontal polarizations be separate and independent of each other. "Element" therefore includes these replacements, i.e., slots, printed circuit dipoles, or rectangular or elliptical micropatch elements, or the like.

Indeed, the true scope and spirit of the present invention is not limited to any of the foregoing particular embodiments, but is limited only by the appended claims and their equivalents.

I claim:

1. A bi-directional spatial power combiner grid amplifier including a lens, a bi-directional grid amplifier, and an array of parasitic elements situated between the lens and the bi-directional grid amplifier, wherein the array of parasitic elements has a first impedance in a first polarization direction and has a second impedance, different from the first impedance, in a second polarization direction orthogonal to the first polarization direction.

2. The device of claim 1, wherein the parasitic elements comprise slots.

3. The device of claim 1, wherein the parasitic elements comprise dipoles.

4. The device of claim 1, wherein the parasitic elements comprise micropatches.

5. The device of claim 4, wherein the micropatches are rectangular.

6. The device of claim 4, wherein the micropatches are elliptical.

7. The device of claim 1, wherein the parasitic elements comprise a first set of elements in the first polarization direction and a second set of elements in the second polarization direction, the elements of the first set being separated from the elements of the second set.

8. The device of claim 7, wherein the parasitic elements comprise slots.

9. The device of claim 7, wherein the parasitic elements comprise dipoles.

10. The device of claim 7, wherein the parasitic elements comprise micropatches.

11. The device of claim 10, wherein the micropatches are rectangular.

12. The device of claim 10, wherein the micropatches are elliptical.

13. The device of claim 1, wherein the parasitic elements comprise a first set of elements in the first polarization direction and a second set of elements in the second polarization direction, the elements of the first set being crossed on the elements of the second set.

14. The device of claim 13, wherein the parasitic elements comprise slots.

15. The device of claim 13 wherein the parasitic elements comprise dipoles.

16. The device of claim 13, wherein the parasitic elements comprise micropatches.

17. The device of claim 16, wherein the micropatches are rectangular.

18. The device of claim 16, wherein the micropatches are elliptical.

* * * * *